(12) United States Patent
Jain et al.

(10) Patent No.: US 9,059,116 B2
(45) Date of Patent: Jun. 16, 2015

(54) ETCH WITH PULSED BIAS

(75) Inventors: Amit Jain, Mountain View, CA (US); Qian Fu, Pleasanton, CA (US); Wonchul Lee, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 189 days.

(21) Appl. No.: 13/252,813

(22) Filed: Oct. 4, 2011

(65) Prior Publication Data

US 2013/0084708 A1 Apr. 4, 2013

Related U.S. Application Data

(63) Continuation-in-part of application No. 12/744,588, filed as application No. PCT/US2008/083942 on Nov. 18, 2008, now Pat. No. 8,609,546.

(60) Provisional application No. 60/991,124, filed on Nov. 29, 2007.

(51) Int. Cl.
  *B44C 1/22* (2006.01)
  *H01L 21/311* (2006.01)
  *H01L 21/302* (2006.01)
  *H01L 21/3213* (2006.01)

(52) U.S. Cl.
  CPC .... *H01L 21/32136* (2013.01); *H01L 21/31122* (2013.01); *H01L 21/32137* (2013.01)

(58) Field of Classification Search
  CPC .............. H01L 21/32136; H01L 21/32137; H01L 21/31116; H01L 21/02164; H01L 21/02274; H01L 21/0228; H01L 21/205; H01L 21/30655; H01L 21/31144; H01J 37/32082; H01J 37/32137; H01J 37/32165; H01J 37/32706; H01J 37/32192

USPC .................. 257/E21.218, E21.252, E21.312, 257/E21.214, E21.257; 216/67, 37, 69, 49, 216/58, 72, 74, 75, 79, 81; 438/710, 706, 438/719, 723, 695, 737; 156/345.1, 345.41
See application file for complete search history.

(56) References Cited

U.S. PATENT DOCUMENTS

| | | | |
|---|---|---|---|
| 4,985,114 A | 1/1991 | Okudaira et al. | |
| 5,501,893 A | 3/1996 | Laermer et al. | |
| 5,705,433 A | 1/1998 | Olson et al. | |
| 6,051,503 A | 4/2000 | Bhardwaj et al. | |
| 6,251,791 B1 | 6/2001 | Tsai et al. | |
| 6,332,425 B1 | 12/2001 | Kofuji et al. | |

(Continued)

FOREIGN PATENT DOCUMENTS

| | | | |
|---|---|---|---|
| KR | 10-2002-0044001 | 6/2002 | |
| WO | WO 2009073361 A1 * | 6/2009 | .......... H01L 21/3213 |

OTHER PUBLICATIONS

U.S. Appl. No. 12/744,012, filed May 20, 2010.

(Continued)

*Primary Examiner* — Nadine Norton
*Assistant Examiner* — Christopher Remavege
(74) *Attorney, Agent, or Firm* — Beyer Law Group LLP

(57) ABSTRACT

A method for etching features into an etch layer through a patterned mask in a plasma processing chamber is provided. A main etch gas is flowed into the plasma processing chamber. The main etch gas is formed into a main etch plasma. A bias greater than 600 volts is provided. The bias is pulsed at a frequency between 1 Hz and 20 kHz with a duty cycle less than 45%.

15 Claims, 6 Drawing Sheets

(56) References Cited

U.S. PATENT DOCUMENTS

| | | | |
|---|---|---|---|
| 6,716,758 B1* | 4/2004 | Donohoe et al. | 438/706 |
| 6,759,340 B2* | 7/2004 | Nallan et al. | 438/714 |
| 7,547,636 B2* | 6/2009 | Chi et al. | 438/714 |
| 7,682,985 B2 | 3/2010 | Koemtzopoulos et al. | |
| 7,718,538 B2* | 5/2010 | Kim et al. | 438/714 |
| 8,404,598 B2* | 3/2013 | Liao et al. | 438/714 |
| 8,658,541 B2* | 2/2014 | Lee et al. | 438/707 |
| 2001/0051438 A1* | 12/2001 | Shin et al. | 438/706 |
| 2002/0069971 A1 | 6/2002 | Kaji et al. | |
| 2003/0132198 A1* | 7/2003 | Ono et al. | 216/69 |
| 2003/0183599 A1 | 10/2003 | Kikuchi et al. | |
| 2004/0058541 A1 | 3/2004 | Ono et al. | |
| 2005/0183822 A1* | 8/2005 | Ono et al. | 156/345.28 |
| 2006/0154151 A1 | 7/2006 | Anderson et al. | |
| 2009/0184089 A1 | 7/2009 | Chebi et al. | |
| 2010/0273332 A1* | 10/2010 | Edelberg | 438/710 |
| 2012/0208369 A1* | 8/2012 | Nishizuka | 438/714 |
| 2014/0038419 A1* | 2/2014 | Kuo et al. | 438/719 |

OTHER PUBLICATIONS

Office Action dated Jan. 14, 2013 from U.S. Appl. No. 12/744,588.
Final Office Action dated Jun. 12, 2013 from U.S. Appl. No. 12/744,588.
Notice of Allowance dated Aug. 15, 2013 from U.S. Appl. No. 12/744,588.

* cited by examiner

ETCH WITH PULSED BIAS

CROSS REFERENCE TO RELATED APPLICATIONS

This application is a Continuation-in-part application of prior-filed U.S. application Ser. No. 12/744,588 filed on May 25, 2010 now U.S. Pat. No. 8,609,546 which is a 371 of International Application No. PCT/US08/83942 filed on Nov. 18, 2008 which is a non-provisional application of U.S. Provisional Application No. 60/991,124 filed on Nov. 29, 2007.

BACKGROUND OF THE INVENTION

Field of the Invention

The invention relates to a method of forming semiconductor devices on a semiconductor wafer by etching an etch layer.

In etching a silicon based layer through a hard mask the hard mask may erode, which increases the space CD of the features being etched, where the bar CD becomes smaller.

SUMMARY OF THE INVENTION

To achieve the foregoing and in accordance with the purpose of the present invention, a method for etching features into an etch layer through a patterned mask in a plasma processing chamber is provided. A main etch gas is flowed into the plasma processing chamber. The main etch gas is formed into a main etch plasma. A bias greater than 600 volts is provided. The bias is pulsed at a frequency between 1 Hz and 20 kHz with a duty cycle less than 45%.

In another manifestation of the invention, a method for etching features into a silicon layer through a patterned mask in a plasma processing chamber is provided. A main etch gas is flowed into the plasma processing chamber. An inductively coupled RF signal is provided into the plasma processing chamber to form the main etch gas into a main etch plasma. A bias greater than 600 volts is provided through an RF signal with a frequency greater than 2 MHz. The bias is pulsed at a frequency between 1 Hz and 20 kHz with a duty cycle less than 30%.

In another manifestation of the invention, an apparatus for etching an etch layer is provided. A plasma processing chamber is provided. A gas source is connected to the plasma processing chamber. A power source for energizing the plasma processing chamber to form a plasma is connected to the plasma processing chamber. A bias power source for providing a pulsed bias power source for providing a bias greater than 600 volts with a frequency greater than 2 MHz, which is pulsed at a frequency of between 1 Hz and 20 kHz is connected to the plasma processing chamber.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
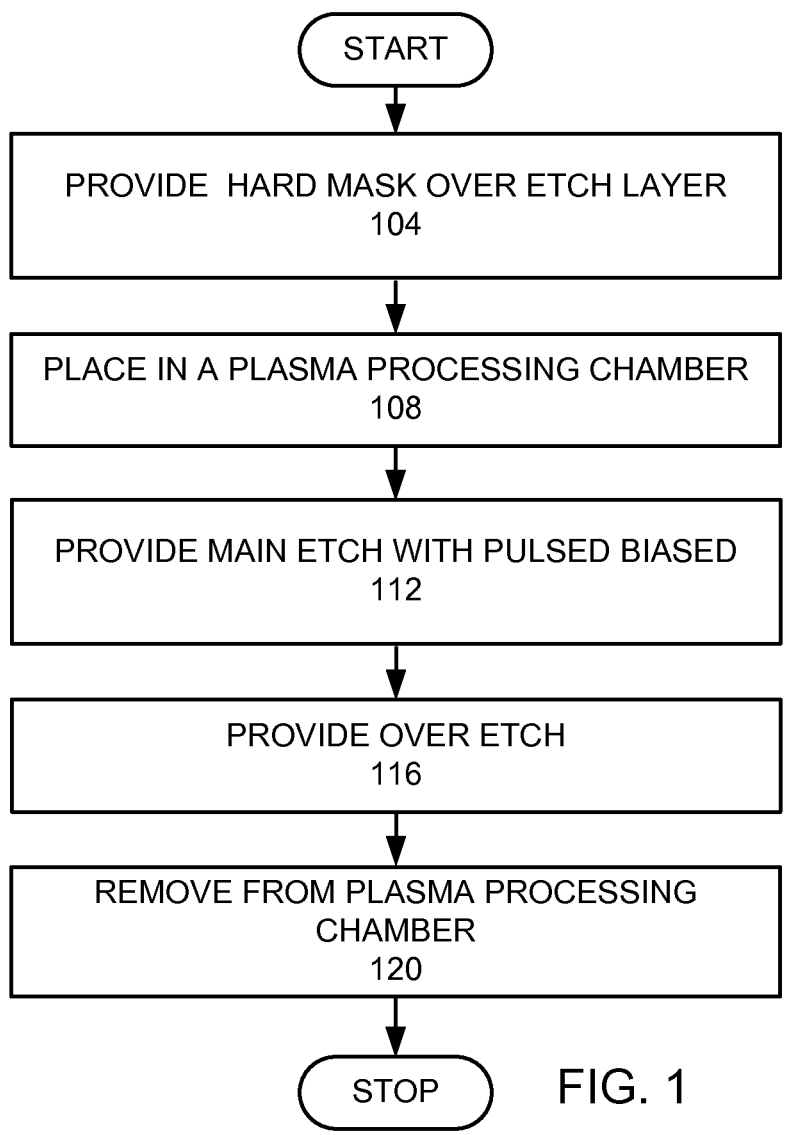
FIG. 1 is a flow chart of an embodiment of the invention.

FIG. 1 is a high level flow chart of an embodiment of the invention. In this embodiment, a patterned hard mask is formed over an etch layer (step 104). The etch layer may be part of a substrate, such as a silicon wafer or may be a layer over the substrate, such as a polysilicon layer formed over a silicon wafer. The etch layer is placed in a plasma processing chamber (step 108). A main etch with a pulsed bias is used to etch features into the etch chamber (step 112). An over etch is provided to complete the etch features (step 116). The substrate is removed from the plasma processing chamber (step 120).

Figure 2A:
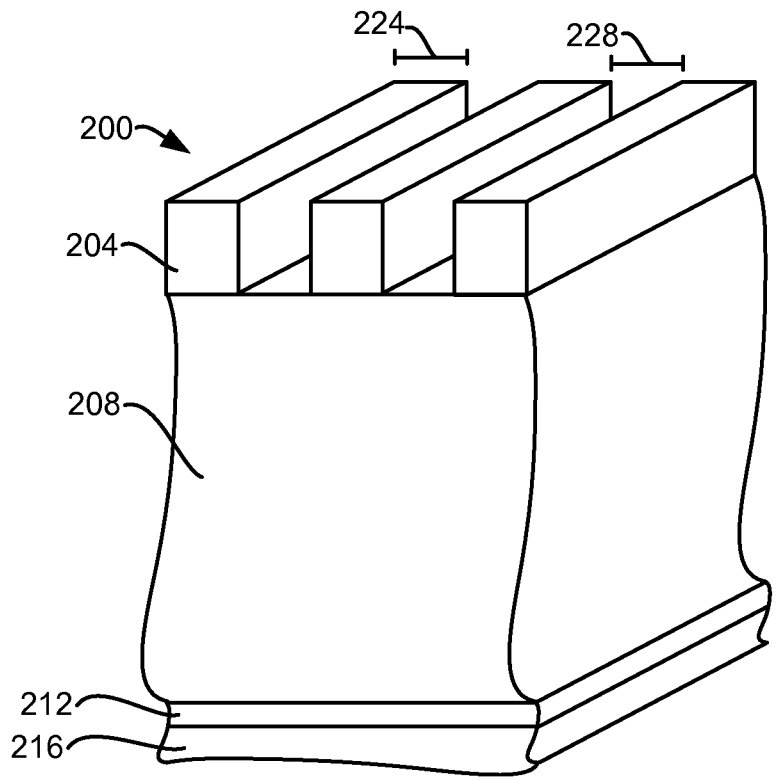
FIGS. 2A-C are schematic views of the formation of etch features using the inventive process.

In a preferred embodiment of the invention, a hard mask of silicon oxide is deposited over a silicon etch layer (step 104). In another embodiment, the hard mask is silicon nitride. FIG. 2A is a schematic cross-sectional view of a stack 200 with a silicon etch layer 208 of polysilicon, over which a patterned silicon oxide hard mask 204 has been formed. One or more intermediate patterning layers, may be disposed between the silicon etch layer 208 and the patterned silicon oxide hard mask 204. In this example, the silicon etch layer 208 is over an etch stop layer 212, which is over a silicon wafer 216. In addition, one or more layers may be above the hard mask 204, between the etch layer 208 and the etch stop layer 212, or between the etch stop layer 212 and the wafer 216. In this example, the hard mask 204 provides a pattern for a memory structure forming lines with a line width 224 and etch feature trenches (the space between the lines) with a trench width 228. In this example, the line width 224 is 16 nm and the trench width is 16 nm. In this embodiment, the etch layer 208 is over the wafer 216. In other embodiments, the etch layer may be the wafer.

Figure 3:
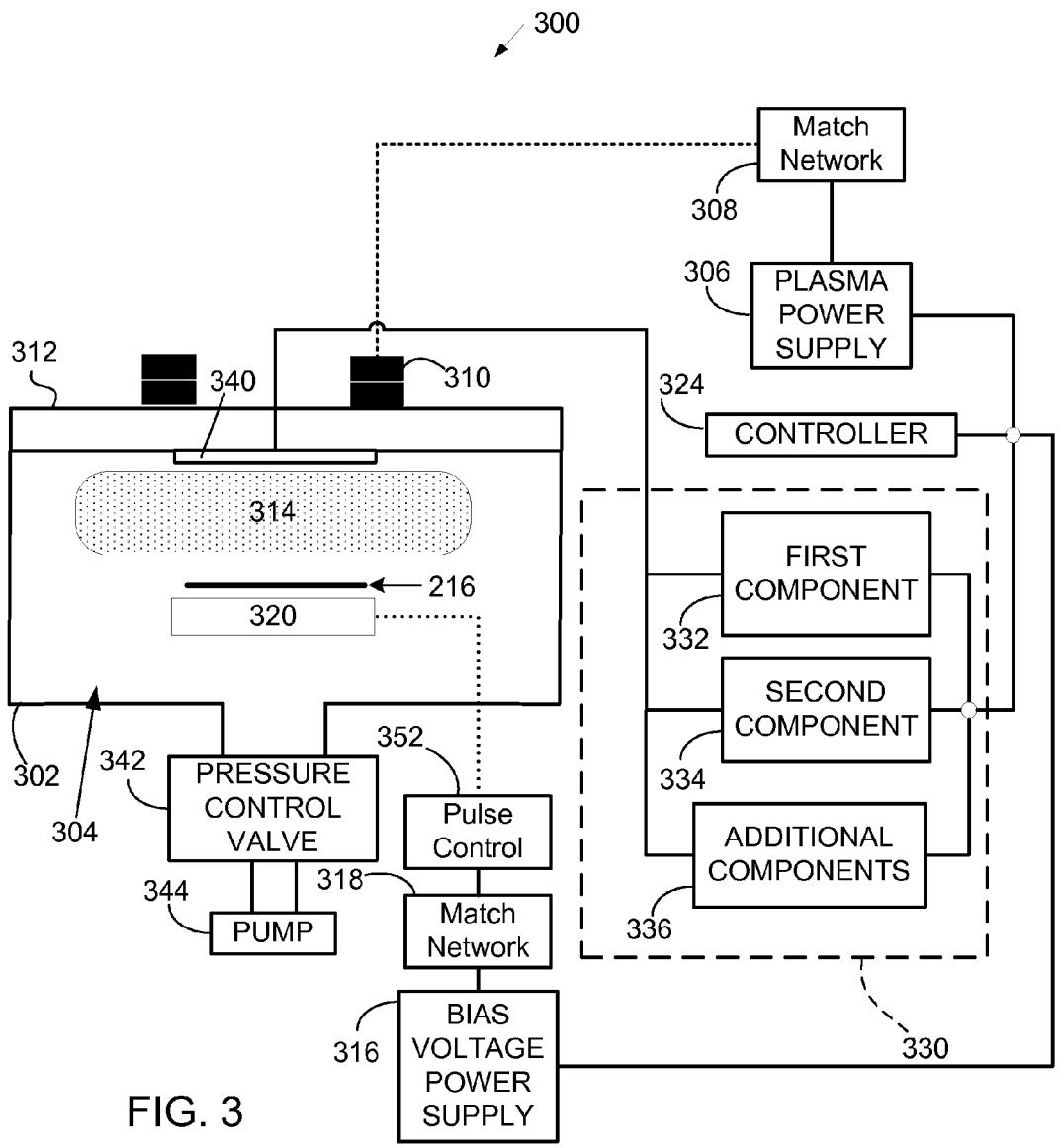
FIG. 3 is a schematic view of a plasma processing chamber that may be used in an embodiment of the invention.

The silicon based etch layer is placed in a processing tool (step 108). FIG. 3 schematically illustrates an example of a plasma processing system 300 which may be used to perform the process of etching the silicon etch layer in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on the wafer 216 which is supported by the electrode 320. A pulse controller 352 causes the bias voltage to be pulsed. The pulse controller 352 may be between the match network 318 and the substrate support or between the bias voltage power supply 316 and the match network 318 or between the controller 324 and the bias voltage power supply 316 or in some other configuration to cause the bias voltage to be pulsed. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage of in a range of 10 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a first component gas source 332, a second component gas source 334, and optionally additional component gas sources 336. The various component gases will be discussed below. The gas sources 332, 334, and 336 are in fluid connection with processing chamber 304 through a gas inlet 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342 and a pump 344, which also serves to maintain a particular pressure within the plasma processing chamber 304. The gas source/gas supply mechanism 330 is controlled by the controller 324. A Kiyo system by Lam Research Corporation may be used to practice an embodiment of the invention.

Figure 4:
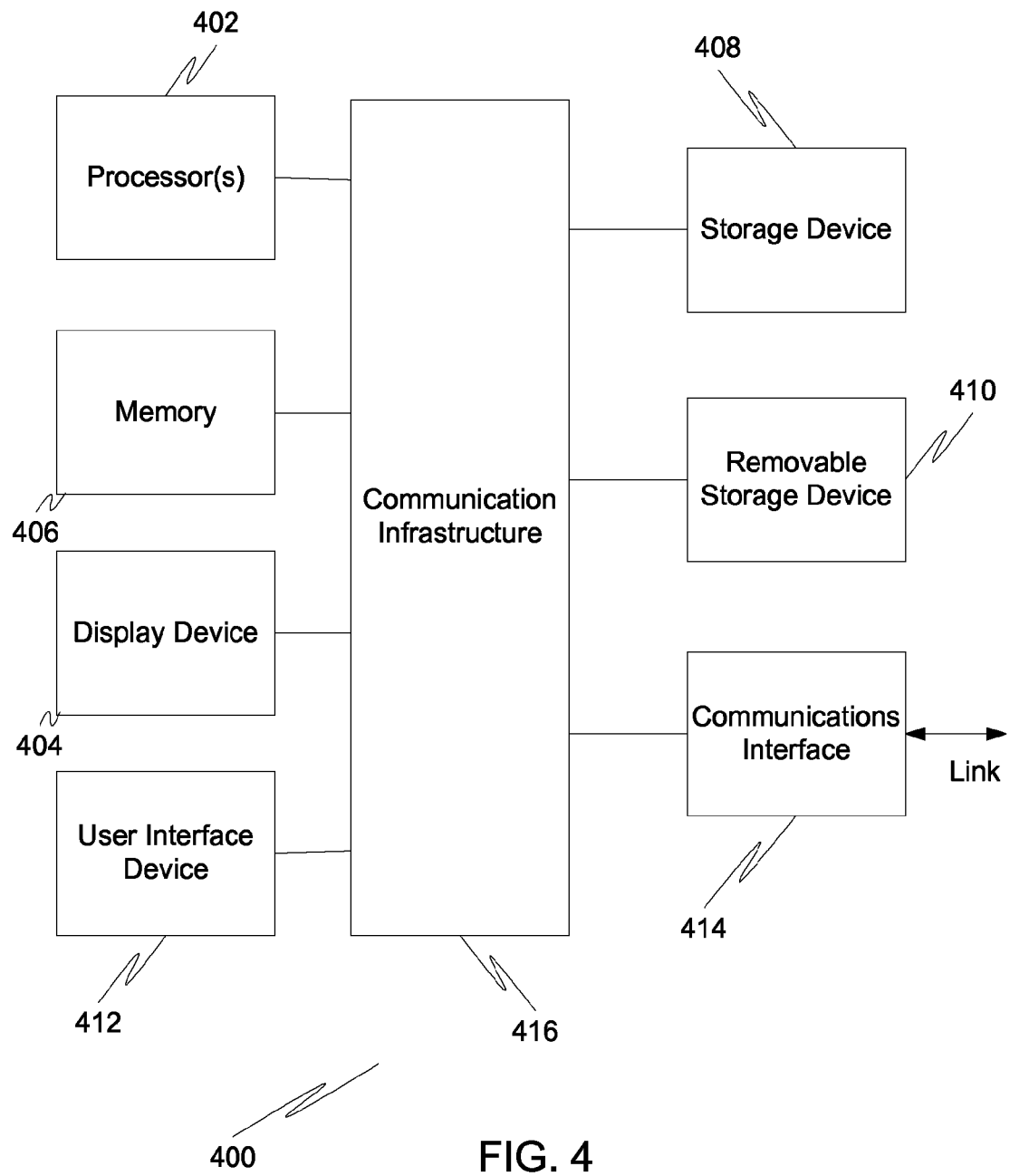
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
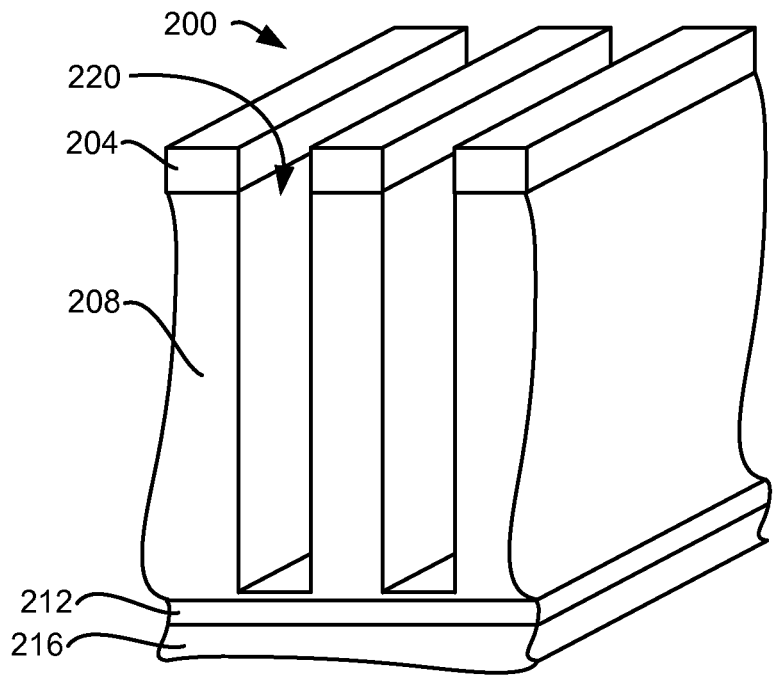
Figure 5:
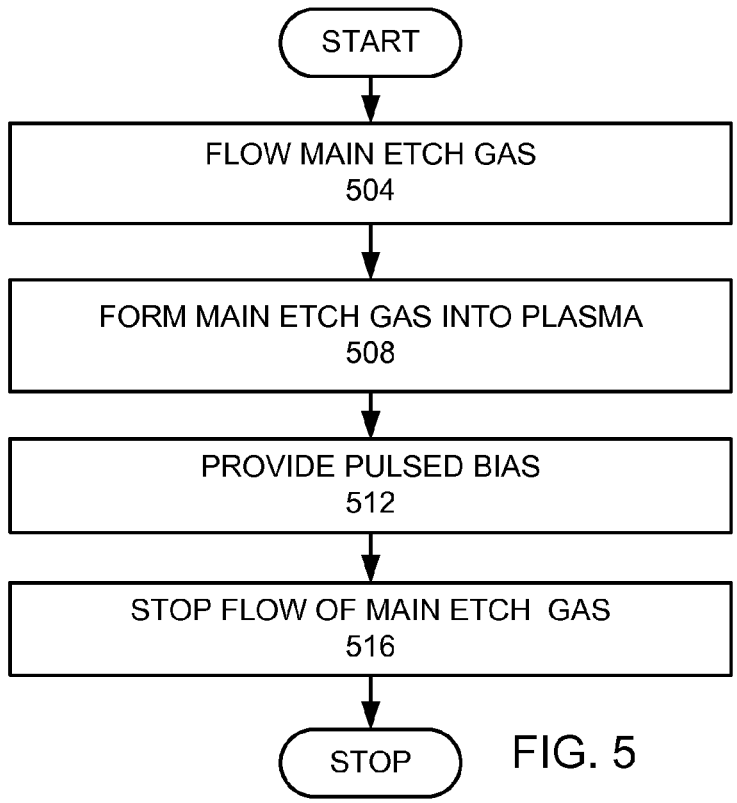
FIG. 5 is a more detailed flow chart of the main etch step.

A main etch with a pulsed bias is provided to etch the etch layer (step 112). FIG. 5 is a more detailed flow chart of the main etch with a pulsed bias. A main gas is flowed into the plasma processing chamber 304 (step 504). RF is provided to form the main etch gas into a plasma (step 508). A pulsed bias is provided to accelerate ions from the plasma from the main etch gas to the etch layer (step 512). The flow of the main etch gas is stopped when the main etch is completed (step 516). FIG. 2B is a cross-sectional view of the stack 200 after the main etch is completed forming etch features 220. After the main etch, the depth of the features have a depth to width aspect ratio of greater than 5:1 and at least 85% of depth of the features is etched.

An example of a main etch provides a main etch gas of 300 sccm HBr, 200 sccm $CF_4$, and 30 sccm $O_2$ into the plasma processing chamber 304 (step 504). A pressure of 20 mTorr is provided. The plasma power supply 306 provides 900 Watts of inductive RF power at 13.56 MHz to the chamber to form the main etch gas into a plasma (step 508). The wafer bias voltage power supply 316 provides a pulsed bias of 850 volts (peak to peak) with a 15% duty cycle to the wafer 216 (step 512). In this embodiment the bias has a frequency of 13.56 MHz and is pulsed at a frequency of 100 Hz.

Figure 6:
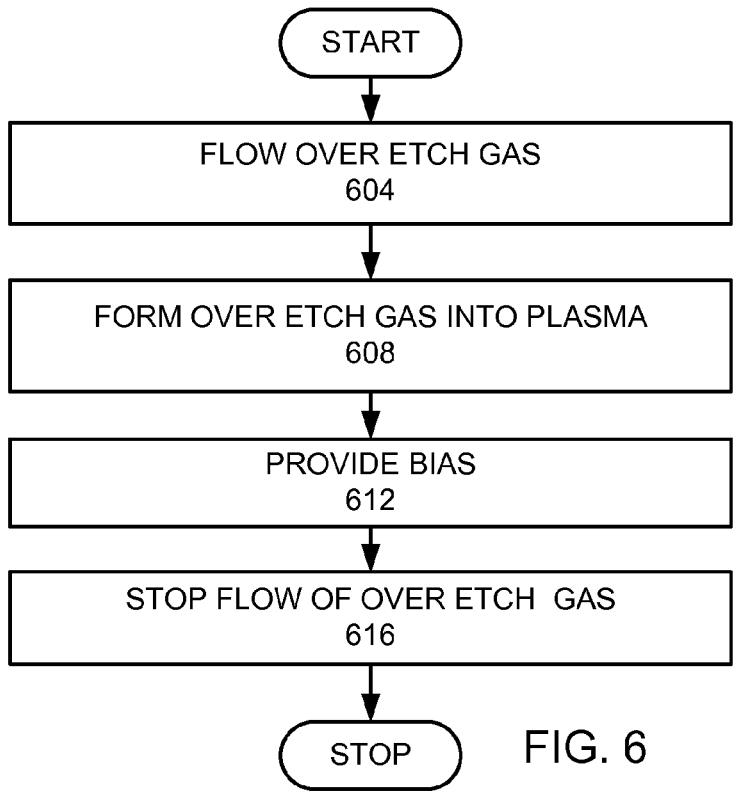
FIG. 6 is a more detailed flow chart of the over etch step.

In this embodiment, an over etch is used to complete the features (step 116). FIG. 6 is a more detailed flow chart of the over etch. An over etch gas is flowed into the plasma processing chamber (step 604). The over etch gas is formed into a plasma (step 608). A bias is applied to the wafer (step 612). The plasma from the over etch gas is used to etch the silicon based etch layer. The flow of the over etch gas is stopped (step 616).

An example of an over etch recipe provides a pressure of 30 mTorr. The gas source/gas supply mechanism provides 200 sccm HBr, and 5 sccm $O_2$, into the plasma processing chamber 304 (step 604). The plasma power supply 306 provides 700 Watts of inductive RF power at 13.56 MHz to the chamber to form the over etch gas into a plasma (step 608). The wafer bias voltage power supply 316 provides a bias of 300 volts to the wafer 216 (step 512). Generally, the bias is less than 600 volts. In this embodiment the bias has a frequency of 13.56 MHz.

Figure 2C:
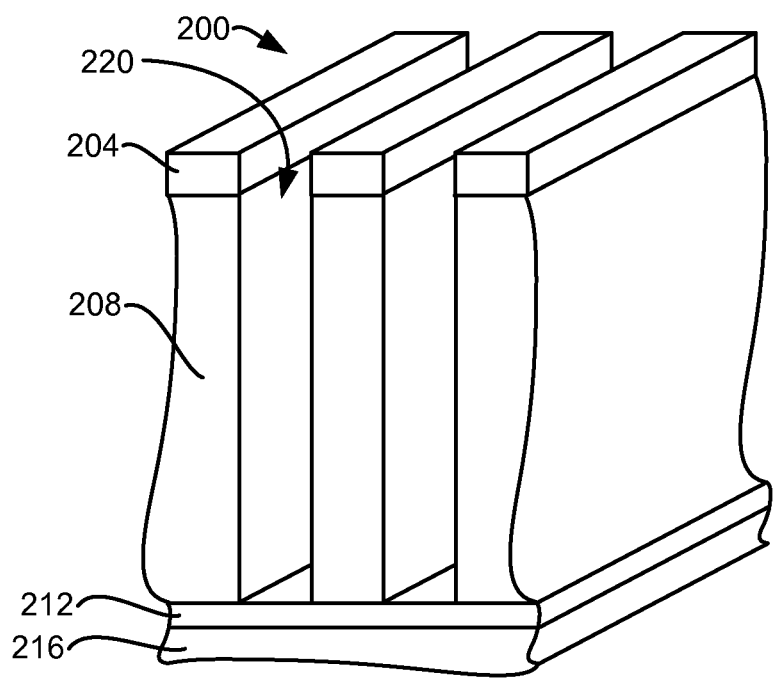

FIG. 2C is a cross-sectional view of the etch layer 208 after the etch is completed completing the etch features 220. In this example, some of the hard mask 204 remains after the etch is completed. In other examples, the hard mask 204 may be completely removed during the etch. In this example, the over etch etches no more than 25% of the depth of the features.

Without being bound by theory, it is believed that for a low voltage bias etching features with no more than 21 nm width and with aspect ratios greater than 5:1, an etch stop is encountered, which prevents the formation of features with widths less than 21 nm and high aspect ratios such as greater than 5:1. It has been found that to provide a high aspect ratio etch for features with widths of no more than 21 nm, a bias voltage of greater than 600 volts is needed. More preferably the bias voltage is between 600 and 1,500 volts. Most preferably, the bias voltage is between 650-1,200 volts.

It has been found that a high bias voltage causes sidewall damage, such as bowing, and erodes the hard mask too quickly. It has been unexpectedly found that pulsing the bias with a low duty cycle allows the etching of high aspect ratio features with widths not greater than 21 nm while reducing sidewall damage and hard mask erosion. It is believed that a low duty cycle pulsing provides a time between the high voltage bias to allow etch by product to passivate the sidewall and hard mask. Such a passivation may include forming a deposition of etch by products on the hard mask and sidewalls. Such a passivation has been found to improve the sidewall profile and reduce etch mask erosion, while allowing the etch of narrow features with a high aspect ratio. Preferably the duty cycle is less than 45%. More preferably, the duty cycle is less than 30%. Most preferably, the duty cycle is between 5% to 20%. A 30% duty cycle is defined as for an entire cycle of bias and no bias, a bias is provided for 30% of the cycle time. Preferably, the bias is pulsed at a frequency of 1 Hz to 20 kHz. More preferably, the bias is pulsed at 10 to 1,000 Hz. In the preferred embodiment, the bias was provided using an RF frequency of 13.56 MHz.

It was unexpectedly found that providing a bias using an RF frequency of 400 kHz to etch silicon provided unacceptable results. More generally, the bias is provided using an RF frequency of at least 2 MHz. More preferably the bias frequency is between 8 and 18 MHz.

By providing a pulsed bias, the flow of gas chemistry may be consistent instead of using gas modulation, which may alternate between an etching gas and deposition gas. Pulsing the bias allows for a faster cycle time compared to gas modulation, which allows a faster etch process than a gas modulation process. Preferably, the gas chemistry is held constant while more than 50% of the feature is etched. More preferably, the gas chemistry is held constant while more than 80% of the feature is etched. It would not be obvious to use such a low duty cycle, since it may be viewed that such a low duty cycle is inefficient.

By reducing the erosion of the mask, the embodiment of the invention reduces a change of the line CD, such as the narrowing of the lines or widening of the spaces as the etch proceeds. In addition, the embodiment of the invention prevents sidewall bowing, which results in straighter and more vertical sidewalls.

Preferably, the feature width is no more than 21 nm. More preferably, the feature width is no more than 16 nm. Preferably, the aspect ratio is at least 5:1. More preferably, the aspect ratio is greater than 15:1.

In other embodiments, the etch layer may be of other materials. Preferably, the etch layer is silicon based, carbon based, or conductive material. More preferably, the etch layer is silicon, carbon, or tungsten. Most preferably, the etch layer is silicon or tungsten.

An alternative main etch gas chemistry for etching silicon would provide a flow of $Cl_2$. A main etch gas chemistry for etching tungsten would be $CF_4/O_2/NF_3$. The etch chemistry used in the main etch to etch carbon would be $O_2$.

Generally, the over etch more selectively etches the etch layer with respect to the etch stop layer. Providing a bias less than 600 volts provides for an increased selectivity. In one embodiment, the over etch bias is not pulsed.

In another embodiment, the main etch completely etches the features so that an over etch is not used or needed.

Experiments were performed to compare the prior art with embodiments of the invention for etching feature widths of 16 nm and aspect ratios of greater than 5:1. Using prior art etch processes with a main etch and a 100% over etch, it was found that not all features were completely etched. It is believed that this is due to an etch stop. Using an embodiment of the invention with 15% over etch it was found that all of the features were completely etched.

By providing reduced feature and line widths the pitch of the lines is reduced allowing more memory devices in a small area.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching features into an etch layer through a patterned mask in a plasma processing chamber, wherein the etch layer is a conductive material, comprising:
    flowing a main etch gas into the plasma processing chamber;
    forming the main etch gas into a main etch plasma;
    providing a bias greater than 600 volts; and
    pulsing the bias at a frequency between 1 Hz and 20 kHz with a duty cycle less than 45%,
    wherein the features have a width of no more than 25 nm.

2. The method, as recited in claim 1, wherein the providing the bias provides the bias at a bias frequency of at least 2 MHz.

3. The method, as recited in claim 2, wherein the bias is provided to a substrate support.

4. The method, as recited in claim 3, wherein the features have a width of no more than 21 nm.

5. The method, as recited in claim 4, wherein the features have a height to width aspect ratio of at least 5:1.

6. The method, as recited in claim 5, wherein the etch layer comprises at least one of tungsten, carbon, or silicon.

7. The method, as recited in claim 5, wherein the providing the main gas provides a constant gas flow during the main etch and wherein at least 80% of depth of the features are etched during the main etch.

8. The method, as recited in claim 7, wherein the providing the bias provides the bias at a bias frequency of between 8 and 18 MHz.

9. The method, as recited in claim 5, wherein the bias voltage is between 650 and 1200 volts.

10. The method, as recited in claim 5, wherein the forming the main etch gas into a main etch plasma, comprises providing an inductively coupled RF power signal into the plasma processing chamber to energize the main etch gas.

11. The method, as recited in claim 5, further comprising providing an over etch which more selectively etches the etch layer with respect to an etch stop layer, comprising:
- providing an over etch gas into the plasma processing chamber;
- forming the over etch gas into an over etch plasma; and
- providing a bias less than 600 volts.

12. The method, as recited in claim 2, wherein the duty cycle is less than 30%.

13. The method, as recited in claim 2, wherein the bias voltage is between 650 and 1200 volts.

14. The method, as recited in claim 2, wherein the forming the main etch gas into a main etch plasma, comprises providing an inductively coupled RF power signal into the plasma processing chamber to energize the main etch gas.

15. The method, as recited in claim 1, wherein the providing the bias provides the bias at a bias frequency of between 8 and 18 MHz.

\* \* \* \* \*